US008250382B2

(12) United States Patent
Maglione et al.

(10) Patent No.: US 8,250,382 B2
(45) Date of Patent: Aug. 21, 2012

(54) POWER CONTROL OF SERVERS USING ADVANCED CONFIGURATION AND POWER INTERFACE (ACPI) STATES

(75) Inventors: Stephen C. Maglione, Raleigh, NC (US); Edward Stanley Suffern, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 1283 days.

(21) Appl. No.: 11/843,181

(22) Filed: Aug. 22, 2007

(65) Prior Publication Data
US 2009/0055665 A1   Feb. 26, 2009

(51) Int. Cl.
*G06F 1/32* (2006.01)

(52) U.S. Cl. ........ 713/300; 713/310; 713/320; 713/321; 713/322; 713/323; 713/324; 713/330; 713/340

(58) Field of Classification Search .................. 713/300, 713/310, 320–324, 330, 340
See application file for complete search history.

(56) References Cited

U.S. PATENT DOCUMENTS

| | | | |
|---|---|---|---|
| 6,985,952 B2 | 1/2006 | Bohrer et al. | |
| 7,131,019 B2 | 10/2006 | Lee | |
| 7,240,227 B2 | 7/2007 | Maezawa | |
| 7,581,125 B2 * | 8/2009 | Ranganathan et al. | 713/320 |
| 7,734,942 B2 * | 6/2010 | Dahlen et al. | 713/323 |
| 2002/0147932 A1 * | 10/2002 | Brock et al. | 713/300 |
| 2003/0005339 A1 * | 1/2003 | Cohen et al. | 713/300 |
| 2003/0065958 A1 * | 4/2003 | Hansen et al. | 713/300 |
| 2003/0065961 A1 * | 4/2003 | Koenen | 713/323 |
| 2003/0115495 A1 * | 6/2003 | Rawson, III | 713/324 |
| 2004/0107273 A1 | 6/2004 | Biran et al. | |
| 2004/0128564 A1 | 7/2004 | Dubinsky | |
| 2005/0216627 A1 | 9/2005 | Goud et al. | |
| 2006/0036878 A1 | 2/2006 | Rothman et al. | |
| 2006/0075112 A1 * | 4/2006 | Polozoff | 709/227 |
| 2006/0161794 A1 * | 7/2006 | Chiasson et al. | 713/300 |
| 2007/0180280 A1 * | 8/2007 | Bolan et al. | 713/300 |
| 2008/0016374 A1 * | 1/2008 | Gee et al. | 713/300 |

* cited by examiner

*Primary Examiner* — M Elamin
(74) *Attorney, Agent, or Firm* — Cynthia G. Seal; Jeffrey L. Streets

(57) ABSTRACT

A method of managing power consumption by a plurality of blade servers within a processing system. The speed of at least one of the plurality of blade servers is reduced in response to the processing system reaching a power or thermal threshold. At least one of the plurality of blade servers is identified as not being critical to maintain in a working state and the critical blade server is put in a sleep state. A satellite management controller may control blade server power consumption and heat generation in various ways that combine processor speed-stepping and control of processor sleep states. Known sleep states save more power than speed-stepping by turning off the processor and/or volatile memory. The processor speed and sleep-states of at least one non-critical blade server, and optionally the processor speed of a critical processor, may be changed in order to control the power consumption below a power threshold or control the temperature below a thermal threshold.

20 Claims, 9 Drawing Sheets

POWER CONTROL OF SERVERS USING ADVANCED CONFIGURATION AND POWER INTERFACE (ACPI) STATES

BACKGROUND OF THE INVENTION

1. Field of the Invention

The present invention relates to power management in a computer system having multiple devices, such as in a rack-based server system or data center.

2. Description of the Related Art

Multiple servers and other computer hardware are often consolidated into a centralized data center. Servers in a data center may be mounted in a rack to conserve space and place the servers and infrastructure within easy reach of an administrator. The IBM eServer BLADECENTER is one example of a compact server arrangement (IBM and BLADECENTER are registered trademarks of International Business Machines Corporation, Armonk, N.Y.).

When multiple servers and other computing hardware are consolidated, power to the servers must be carefully monitored and controlled. Power consumption affects many aspects of operating a data center, such as the costs of operating the servers, the heat generated by the servers, and the performance and efficiency of the system. The individual servers and the system as a whole are limited by design parameters such as maximum power consumption, maximum operating temperature, processing efficiency, and so forth. Thus, it is important to control power to the system in consideration of these parameters.

Existing processing systems may be powered by a common power supply or power distribution unit (PDU). Some of the systems include a circuit, such as a Baseboard Management Controller (BMC), that can monitor real-time power consumption by a server. Using this feedback, the BMC can "throttle" or "speed-step" the processors and/or memory on the server to maintain the power consumption below a set point or "power ceiling" set by an administrator and monitored by the chassis management module. U.S. Pat. No. 7,155,623 to IBM discloses a "Method and System for Power Management Including Local Bounding of Device Group Power Consumption." U.S. Patent Application Publication No. US 2006/0156042 to IBM discloses a "Method, System, and Calibration Technique for Power Measurement and Management Over Multiple Time Frames."

However, speed-stepping the processors can only bring about a limited reduction in power consumption. When there is a critical need for greater power reductions than can be achieved by speed-stepping the processors, then the typical solution is to power off one or more of the blade servers within the power distribution unit. Unfortunately, shutting off the power to a blade server causes a loss of user data.

Therefore, there is a need for improved power management systems and methods that can achieve large reductions in power consumption without loss of user data. It would be desirable for the improved power management systems and methods provided greater flexibility in selecting where and how power consumption will be reduced, so that system performance is maintained or optimized under the prevailing power constraints.

SUMMARY OF THE INVENTION

One embodiment of the invention provides a method of managing the amount of power consumed by a plurality of blade servers within a processing system. In a preferred embodiment, the method further includes reducing the speed of at least one of the plurality of blade servers in response to determining that the processing system has reached a thermal or power threshold. The method comprises identifying at least one of the plurality of blade servers that is not critical to maintain in a working state, and putting the at least one non-critical blade server in a sleep state in response to determining that the processing system has reached a thermal or power threshold. Accordingly, a satellite management controller or management entity, such as a chassis management module or remote management console, may control blade server power consumption and heat generation in various ways that combine processor speed-stepping and control of processor sleep states.

Optionally, the satellite management controller may place the at least one non-critical blade server in a sleep state by sending an Intelligent Platform Management Interface (IPMI) message to command the Baseboard Management Controller (BMC) to put the at least one non-critical blade server in a sleep state. The BMC may put the at least one non-critical blade server in the sleep state by sending an IPMI message to the operating system. The sleep state is preferably a "standby" state that loads the contents of the operating system in the main (volatile) memory and maintains power to main memory within the device while power is shut off to the processor and a majority of other components within the device. Alternatively, the sleep state may be a "hibernation" state that saves the content of the operating system from main memory within the device to a hard drive and turns off the power to both the processor and the main memory. Although both of these sleep states save power by turning off the processor, the "hibernation" state consumes less power because it also turns off the volatile memory. Accordingly, the processor speed and sleep-states of at least one non-critical blade server, and optionally the processor speed of a critical processor, may be changed in order to control the power consumption below a power threshold or control the temperature below a thermal threshold. It is possible to incrementally change the processor speed across multiple speeds or incrementally change the sleep state across multiple sleep states in order to achieve finer adjustments in the power consumption or temperature.

Another embodiment provides a computer program product comprising a computer usable medium including computer usable program code for managing power in a computer system. The computer program product includes computer usable program code for identifying at least one of the plurality of blade servers that is not critical to maintain in a working state, and computer usable program code for putting the at least one non-critical blade server in a sleep state in response to determining that the processing system has reached a thermal or power threshold. Other aspects of the method described above may also be implemented in computer usable program code.

A further embodiment provides a power-controlled processing system. The system comprises a plurality of rack-mounted ACPI-capable blade servers, a shared power supply providing electrical power to each of the plurality of servers, and a satellite management controller. Each of the blade servers has a processor running an operating system and a baseboard management controller in digital communication with the operating system and the satellite management controllers. The satellite management controller includes computer usable program code for identifying at least one of the plurality of blade servers that is not critical to maintain in a working state, and putting the at least one non-critical blade server in a sleep state in response to determining that the processing system has reached a thermal or power threshold.

Additional aspects of the method described above may also be implemented in computer usable program code and included in the satellite management controller.

Other embodiments, aspects, and advantages of the invention will be apparent from the following description and the appended claims.

DETAILED DESCRIPTION OF PREFERRED EMBODIMENTS

Figure 1:
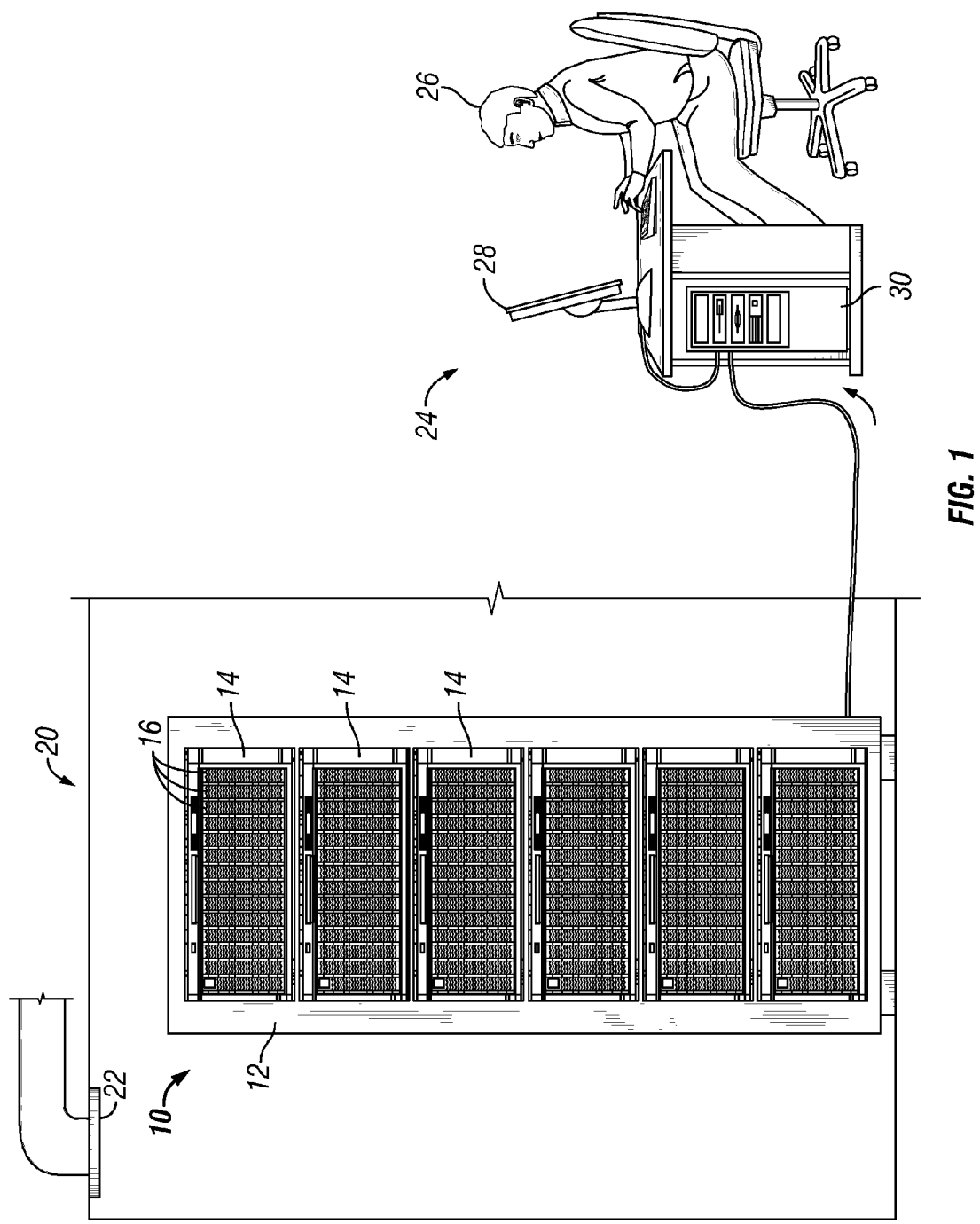
FIG. 1 is a front elevation view of an exemplary rack-mounted blade server system in a data center that may be power-managed according to the invention.

The present invention provides improved systems and methods for managing power consumption and/or temperature in a processing system having multiple components or devices, such as in a multi-server computer system. Embodiments of the invention are particularly suitable for management of power in rack-based computer system, such as blade server systems and in data centers. The invention includes methods for dynamically controlling the devices to achieve a desired power consumption or temperature.

One embodiment of the invention provides a method of managing the amount of power consumed by a plurality of blade servers within a processing system. The method comprises identifying at least one of the plurality of blade servers that is not critical to maintain in a working state. Preferably, a system administer will determine which blade servers or servers are not critical and input this information into a table, so that this information can be accessed at any time and automatically used in the management of power. The method further includes putting the at least one non-critical blade server in a sleep state in response to determining that the processing system has reached a thermal or power threshold. A thermal threshold or power threshold may be fixed or dynamic setpoints that represent critical temperatures or power supply limits in the target system. Methods of controlling the plurality of blade servers may be implemented to limit the temperature of individual blade servers within the processing system, power consumption within the processing system, or both. In methods for controlling both temperature and power consumption, the control loop that requests a lower operational state of the blade server will generally take control at any given moment. Although the disclosure that follows is primarily directed to managing power consumption, it should be recognized that the methods are equally applicable to temperature control within the processing system.

In a preferred embodiment, a satellite controller may place the at least one non-critical blade server in a sleep state by sending an Intelligent Platform Management Interface (IPMI) message to command the Baseboard Management Controller (BMC) to put the at least one non-critical blade server in a sleep state. The BMC may put the at least one non-critical blade server in the sleep state by sending an IPMI message to the operating system (OS).

The term "Intelligent Platform Management" refers to autonomous monitoring and recovery features implemented directly in platform management hardware and firmware. The key characteristics of Intelligent Platform Management is that inventory, monitoring, logging, and recovery control functions are available independent of the main processors, BIOS, and operating system. Platform management functions can also be made available when the system is in a powered down state. IPMI is a hardware level interface specification that is management system neutral and provides monitoring and control functions that can be exposed through standard management software interfaces, such as DMI, WMI, CIM, and SNMP. As a hardware level interface, IPMI sits at the bottom of a typical management software stack.

IPMI is best used in conjunction with system management software running under the operating system. This provides an enhanced level of manageability by providing in-band access to the IPMI management information and integrating IPMI with the additional management functions provided by management applications and the operating system.

The IPMI message may indicate that the at least one non-critical blade server should be put in a specific sleep state, preferably a standby state that maintains power to main memory within the device while power is shut off to a majority of other components within the device, or a hibernation state that saves the content of main memory within the device to a hard drive and powers off the main memory. Accordingly, the sleep-states of at least one non-critical blade server may be changed in order to control, or assist in the controlling, the power consumption below a power threshold or control the temperature below a thermal threshold.

Most preferably, a satellite controller, such as the chassis management module or a satellite management console, sends an IPMI message to the BMC via an Intelligent Platform Management Bus (IPMB). The BMC picks up the message through an IPMB Message Interface and passes the message to the Message Handler. The payload of the present IPMI message is then forwarded to the operating system through the System Message Interface and instructs the operating system to put the blade server's processor in a sleep state. The operating system and the processors within the blade server must be compatible with the Advanced Configuration and Power Interface (ACPI) specification, which defines common interfaces for hardware recognition, motherboard and device configuration and power management.

Because the IPMI system operates independent of the processing system, the present invention may include sending a subsequent IPMI message to the operating system or the Basic Input Output System (BIOS) in order to change the processor sleep state or put the processor into a normal working state where the operating system and applications are running. Consequently, the method of the present invention allows a satellite management controller to control the blade server's processor states between sleeping and working states as desired to manage power consumption or temperatures within the processing system.

In a preferred embodiment, the method further includes reducing the speed of at least one of the plurality of blade servers in response to determining that the processing system has reached a thermal or power threshold. Accordingly, a satellite management controller or management entity, such as a chassis management module or remote management console, may control power consumption and temperature in various ways that combine processor speed-stepping and control of processor sleep states. This combination of techniques allows power management to be performed with finer granularity, meaning that there is a greater number of power saving options that allows more precise power management. It should also be recognized that providing the satellite management controller with the ability to control sleep states allows a broader range of power management options. In particular, the satellite management controller is able to put one or more non-critical blade servers into a sleep state so that the available power can support the operation of critical blade servers.

Another embodiment of the invention provides a computer program product comprising a computer usable medium including computer usable program code for managing power in a computer system. The computer program product includes computer usable program code for identifying at least one of the plurality of blade servers that is not critical to maintain in a working state, and computer usable program code for putting the at least one non-critical blade server in a sleep state in response to determining that the processing system has reached a thermal or power threshold. Other aspects of the method described above may also be implemented in computer usable program code.

A further embodiment provides a power-controlled processing system. The system comprises a plurality of rack-mounted ACPI-capable blade servers, a shared power supply providing electrical power to each of the plurality of blade servers, and a satellite management controller. Each of the blade servers has a processor running an operating system and a baseboard management controller in digital communication with the operating system and the satellite management controllers. The satellite management controller includes computer usable program code for identifying at least one of the plurality of blade servers that is not critical to maintain in a working state, and putting the at least one non-critical blade server in a sleep state in response to determining that the processing system has reached a thermal or power threshold. Additional aspects of the method described above may also be implemented in computer usable program code and included in the satellite management controller.

According to a still further embodiment, the foregoing methods of managing power in a processing system may be used in cooperation with a power capping method to allocate power among the devices in a target system. In a typically power capping method, a "target system" is selected for which power is to be managed. The target system may be, for example, an entire datacenter, one or more rack-based server systems in a datacenter, or a subsystem thereof. The target system includes a plurality of "devices" powered by one or more shared power supply. For example, in a rack-based server system having a plurality of servers, blowers, switches, power supplies, and other support modules, the selected target system may be the plurality of servers. A global ("net") power limit is selected for the target system. The net power limit may be selected by a system designer, a system operator (user), or by hardware and/or software. The net power limit may be imposed, for example, to limit operating costs, heat, or sound levels generated by the target system. The net power limit is apportioned among the devices of the target system according to their respective power consumption.

The satellite management controller, such as the chassis management module (MM), apportions a net power limit among the devices of a target system. Each device may include an associated "local controller" for monitoring and controlling power to the device. The satellite management controller and the local controllers may work together to control the distribution of power to the servers according to the needs of the servers, as may be determined according to the real-time power consumption of the servers. The local controller typically includes a precision measurement and feedback control system that may be implemented on the BMC. Each local controller communicates information regarding the power consumption of its associated device to the management module. The management module apportions the net power limit among the devices according to their present power consumption and communicates the apportioned power limits to the local controllers. The local controller enforces the apportioned power limits on behalf of the MM. Thus, net power to the target system is maintained within the net power limit, while power to each device is individually maintained within its dynamically apportioned power limit. Typically, the management module will determine which device(s) have excess allocated power, and the associated local controllers (at the direction of the MM) would reclaim an excess portion of the allocated power before redistributing that reclaimed power among the devices. In other embodiments, however, power limits may be reclaimed from the device(s) having excess power margins and substantially simultaneously redistributed among the devices without substantially exceeding the net power limit at any instant. It should be recognized that the net power limit may also be changed manually or automatically by the MM in response to power availability or to control net power consumption over time.

Under normal operating conditions, the net power limit may be sufficient to dynamically apportion each device with a power limit in excess of its power consumption. This results in a positive "power margin" or "overhead," which is the difference between a device's apportioned power limit and its power consumption. Because the amount of power consumed by each device is typically dynamic, the apportioned power limit for each device is also dynamic. One approach that may be implemented is to provide each device with at least a selected minimum power margin. Typically, the net power limit is evenly apportioned among the devices of the target system in such a way that every device has about the same power margin at any given moment. If the circumstance arises that the net power consumption of the target system exceeds the net power limit, the MM may respond by lowering the net power limit, to effectively impose a "negative" power margin or overhead on some or all of the devices of the target system, wherein the apportioned power limit for the devices is less than the power consumption detected prior to the imposition of the negative overhead. The BMC may respond to the imposition of negative overhead in such a contingency by throttling the blade servers and/or memory, and changing the sleep states of the processors in the blade servers, in accordance with the present invention, in order to reduce the power consumption of each device to within its apportioned power limit.

FIG. 1 is a front elevation view of an exemplary rack-mounted blade server system ("rack system") 10 in a data center 20 that may be power-managed according to the invention. The rack system 10 includes many of the same components and design features of a conventional rack system. However, the rack system 10 is adapted to include hardware and software elements for implementing a power management scheme according to the present invention. Some familiar aspects of the rack system 10 include a rack 12 supporting six server chassis 14. Each server chassis 14 in this example consists of a 7U by 28-in. (711-mm) deep chassis with a support structure for up to fourteen networked blade servers 16. Thus, the rack 12 holds up to eighty-four heat-generating blade servers and supporting modules, all of which must be power-managed and air-cooled. Each server chassis 14 contains a blower module shared by the servers 16 for circulating air through the servers 16 contained within the server chassis 14. Heated air expelled from the rack system 10 is taken up by an air intake 22 and circulated through a computer-room air-condition system (CRAC) that cools the air and returns it to the data center 20.

A workstation 24 is optionally networked with the servers 16 for helping a system administrator 26 remotely monitor and control the servers 16. The workstation 24 includes a display 28, which has a customizable graphical administrative interface, and a satellite management controller console 30, which can remotely support up to thousands of remote computer subsystems including the servers 16. Local software (e.g. a system "agent") may be installed on each server 16, allowing the management controller 30 to selectively interface with the various servers 16 to monitor and control the servers 16. For example, an agent installed on a particular server 16 may warn the system administrator 26 if and when intervention is required for that blade server.

The blade servers 16 and other devices generate heat within the computer system 10. In particular, each blade server 16 consumes power and produces heat, which may be a function of numerous factors, such as the amount of load placed on its processor(s) ("processor load"). Processor load generally relates to computational throughput, and is typically tied to factors such as processor speed, clock speed, bus speed, the number of individual processors recruited for performing a task, and so forth. Thus, processor performance metrics such as MIPS ("million instructions per second") or teraflops may be used to describe processor load. The amount of processor load may also be characterized in terms of a processor's maximum processing capacity, such as "percentage of full processor utilization." The percent utilization of a group of processors may be expressed in terms of the combined processing capacity of the multiple processors. For example, at an instant in time, a hypothetical three-processor server may have a first processor operating at 33%, a second processor operating at 50%, and a third processor operating at 67%, with an overall/average processor utilization for the server of 50%. The load on processors is typically dynamic, so the percent utilization, itself, may be expressed instantaneously or as an average utilization over time.

Figure 2:
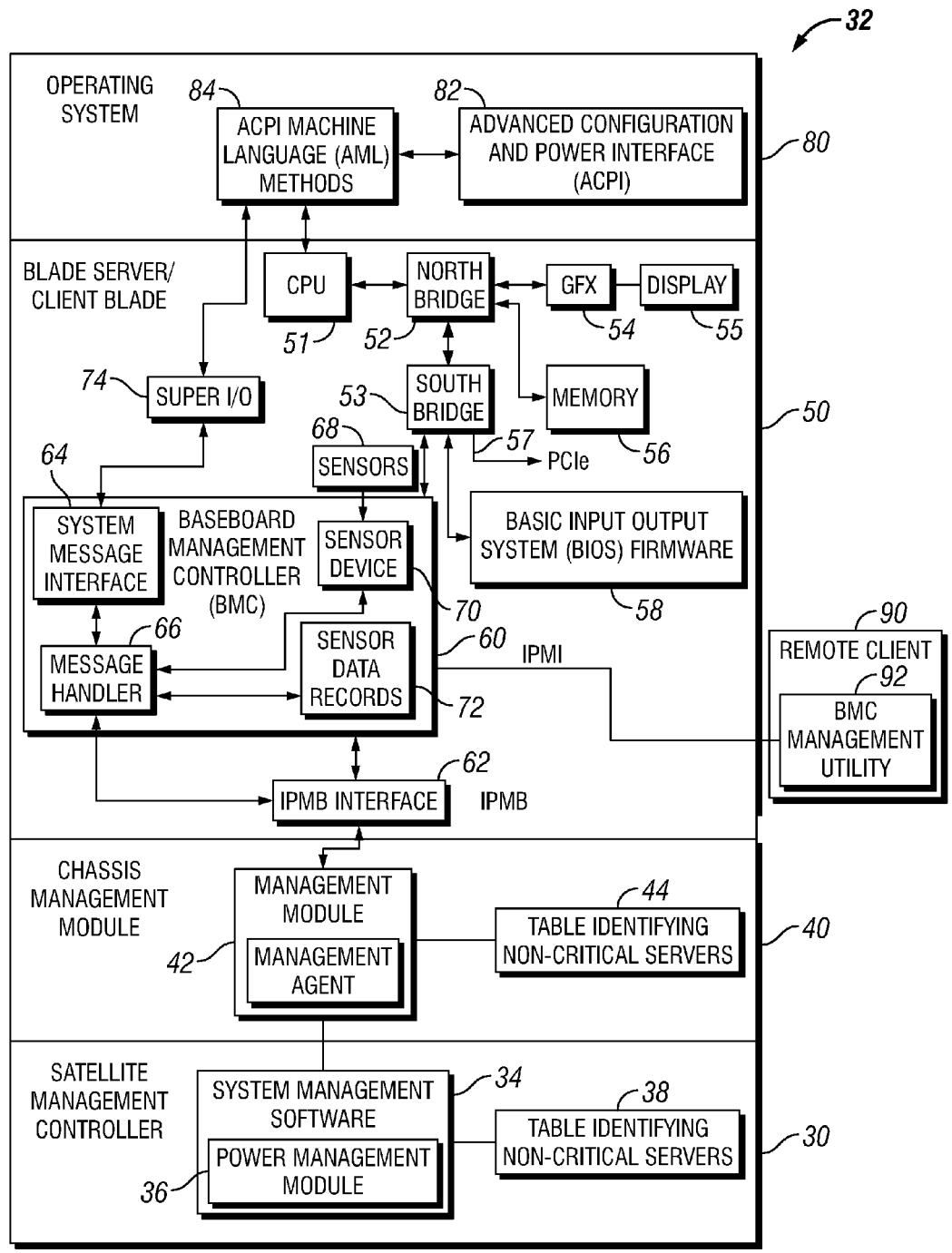
FIG. 2 is a block diagram of a processing system including a satellite management controller, a chassis management controller, a client blade running an operating system, and a remote client.

FIG. 2 is a block diagram of a processing system 32 including a satellite management controller 30, a chassis management controller 40, a client blade 50 running an operating system 80, and a remote client 90. The satellite management controller 30 may be a stand-alone computer console running system management software (SMS) 34, such as IBM DIRECTOR, including a power management module 36, such as IBM POWEREXECUTIVE (IBM, DIRECTOR, and POWEREXECUTIVE are trademarks of International Business Machines Corporation of Armonk, N.Y.). The satellite management controller 30 may be located within or outside the datacenter 20 and may communicate with the management module 40 of the chassis 14 (See FIG. 1) over an Ethernet connection. Each chassis management module 40 runs a management module program 42, including a management agent 44 for interfacing with the system management software 34. and having access to memory for storing a list or table 44 that identifies the non-critical and/or critical blade servers within the chassis 14.

The power management of the present invention may be implemented in software running within the satellite management controller 30, the chassis management module 40, or some combination thereof. One advantage of managing power consumption from the satellite management controller 30 is that the method can simultaneously manage power in multiple chassis 14. When the satellite management controller 30 implements the method, the controller 30 preferably has access to memory for storing a list or table 38 that identifies the non-critical and/or critical blade servers within each chassis 14. Alternatively, the management module 42 in each chassis may include its own table 44.

The chassis management module 40 is in communication with each blade server 50 or client blade within the chassis 14. The blade server 50 includes a typically hardware configuration, including, without limitation, a CPU 51, a north bridge 52, a south bridge 53, a graphics card 54, video output 55, RAM memory 56, a PCIe bus 57, and BIOS 58. Other components and details of a typical blade server will be known to those having skill in the art.

The blade server 50 is also includes Intelligent Platform Management. A baseboard management controller (BMC) 60 provides the intelligence behind Intelligent Platform Management and manages the interface between system management software 34, blade server hardware 51-58, and the operating system 80. The BMC 60 includes an IPMB Interface 62 for communicating with the management module 42 and a System Message Interface 64 for communicating with the operating system 80. A message handler 66 of the BMC handles IMPI messages to and from these interfaces. The BMC 60 is also in communication with various sensors 68 within the blade server 50, such as a CPU temperature sensor and a power supply output gauge. The sensors 68 communicate with a sensor device 70 for discovering, configuring and accessing sensors. Sensor data is then reported to the Message Handler 66 logging in the sensor data records. Upon receiving a request for sensor data from the system management software 34 or the management module 42, the Message Handler 66 retrieves and sends out the sensor data via the IPMB Interface 62.

The operating system 80 includes typically operating system components, including an Advanced Configuration and Power Interface (ACPI) 82. The ACPI 82 uses its own ACPI Machine Language (AML) 84 for implementing a power event handler or AML method. The AML method 84 receives instructions from the BMC 60 through the system message interface 64 and the general purpose I/O ports of a Super I/O 74. The AML method 84 puts the CPU 51 in a sleep state, in accordance with the instructions, and may send messages back to the BMC confirming the new ACPI state of the CPU 51.

In accordance with the embodiment of FIG. 2, a management entity, such as the system management software 34 or management module 42, may implement the power management by sending IPMI messages that instruct the operating system to control the ACPI state of the processor(s) in a blade server that has been identified as being non-critical and sending IPMI messages that instruct the operating system to control the speed step of the processor(s). Accordingly, upon detecting high power utilization or high processor temperature, the management entity may put one or more processors to sleep and, optionally, speed step one or more other processors in order to manage power or temperature within a processing system.

The management entity may also wake or restart a processor in a sleep state and increase the speed step of the processor in response to detecting that a sufficient power margin exists, detecting a temperature below the temperature threshold, or both. The management entity wakes a processor by sending a power command from the BMC's System Message Interface 64 to the Super I/O 74. Both the BMC and the Super I/O remain operational regardless of the sleep state of the blade server operating on minimal stand-by power. Once the Super I/O detects the power command, it turns on power to the rest of the hardware and resumes the operation of the blade server from the sleep state. The previous operational state of the blade server is obtained either from the memory or the hard drive depending on the sleep or hibernate state.

In embodiments where the blade server is a client blade, the system 32 may further include a remote client or "thin client" 90 that provides the user interface for an individual user. However, the operating system, applications, data storage, and processing capability reside on the client blade. The remote client 90 sends and receives data with the client blade 50 via an Ethernet network. However, the remote client 90 may also include a BMC Management Utility 92 and utilizes IPMI Over LAN communications with the BMC 60.

Figure 3A:
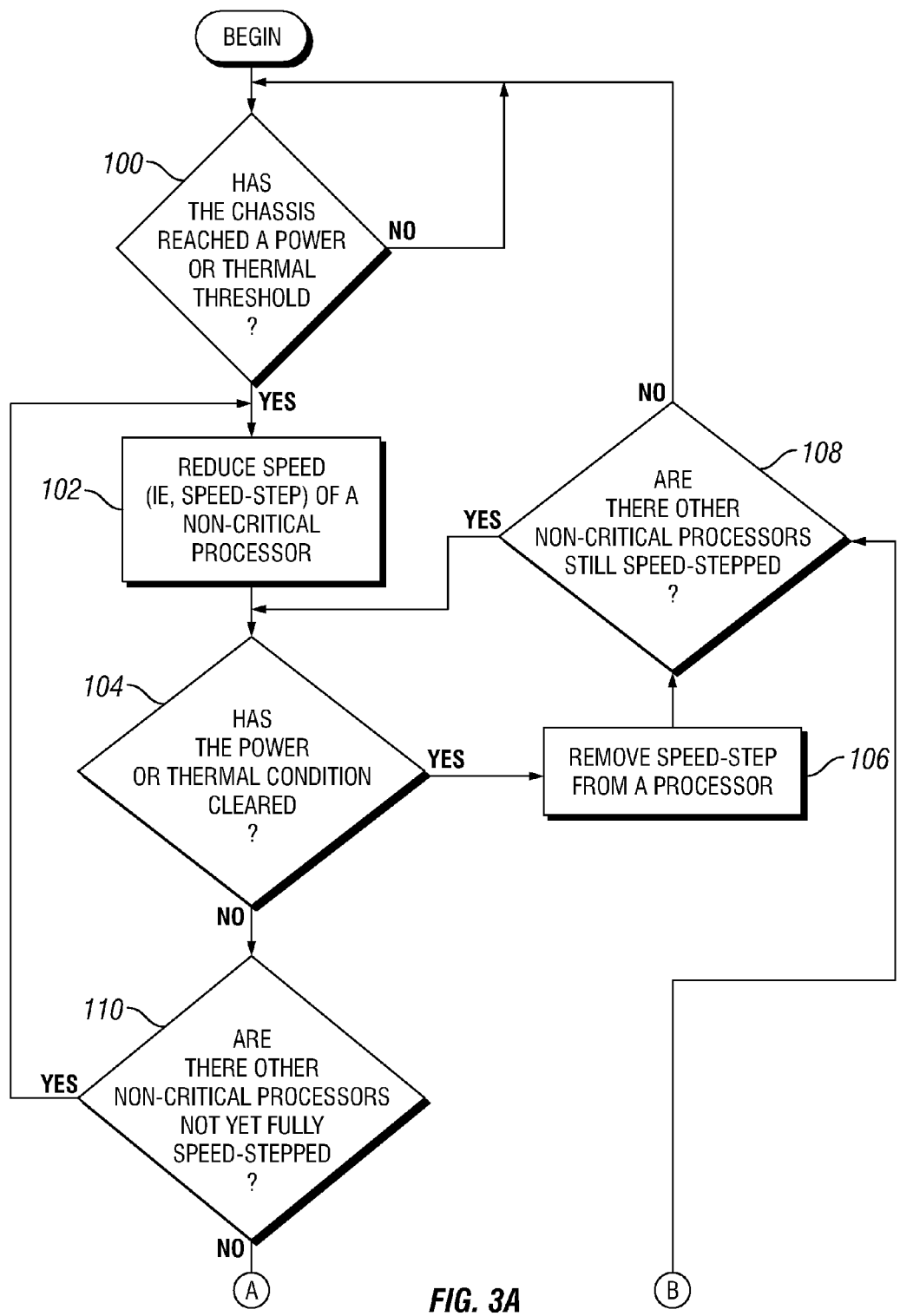
FIGS. 3A to 3C provide a flowchart of a method for a managing power consumption or temperature within the chassis.
Figure 3B:
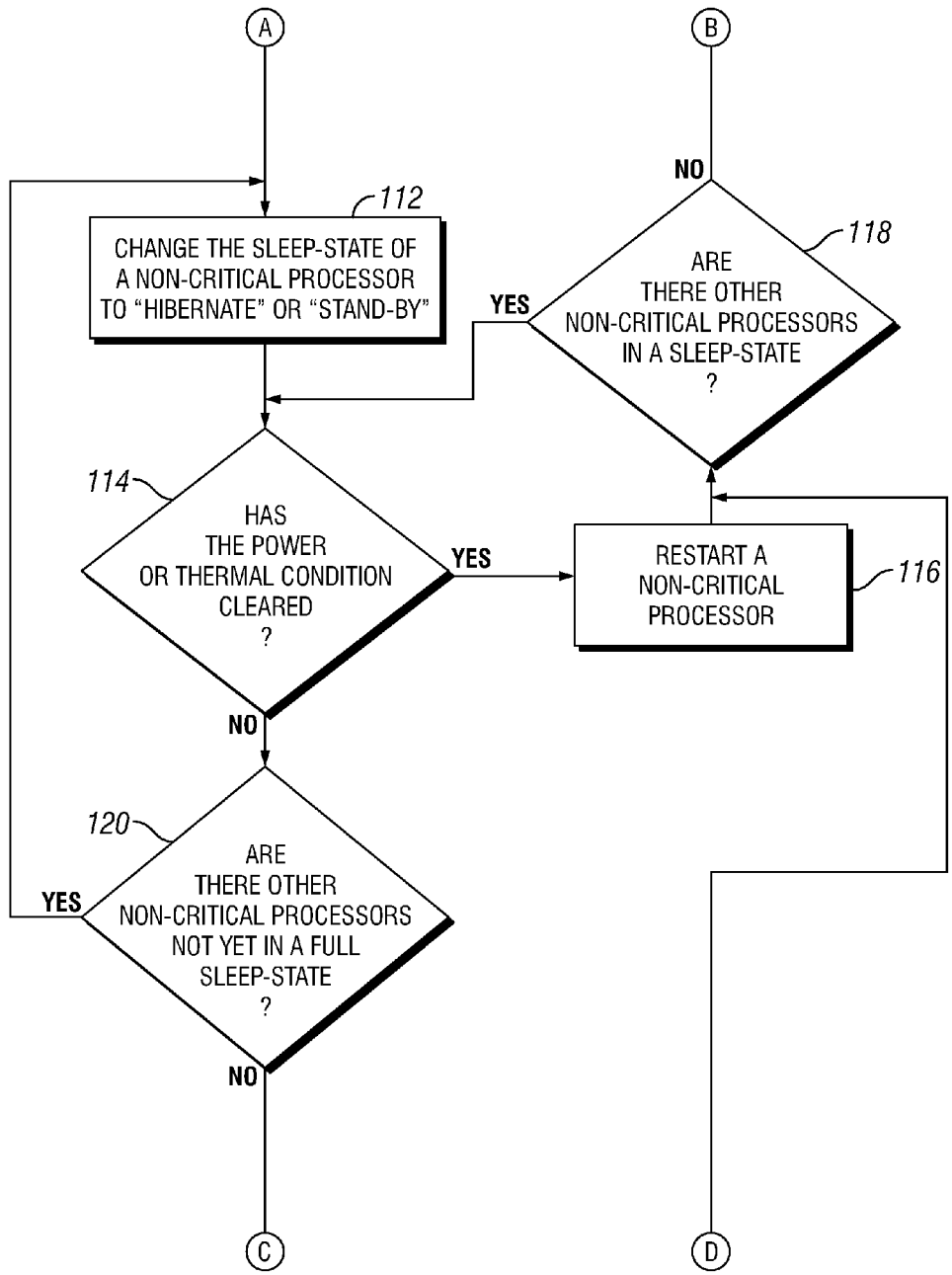
Figure 3C:
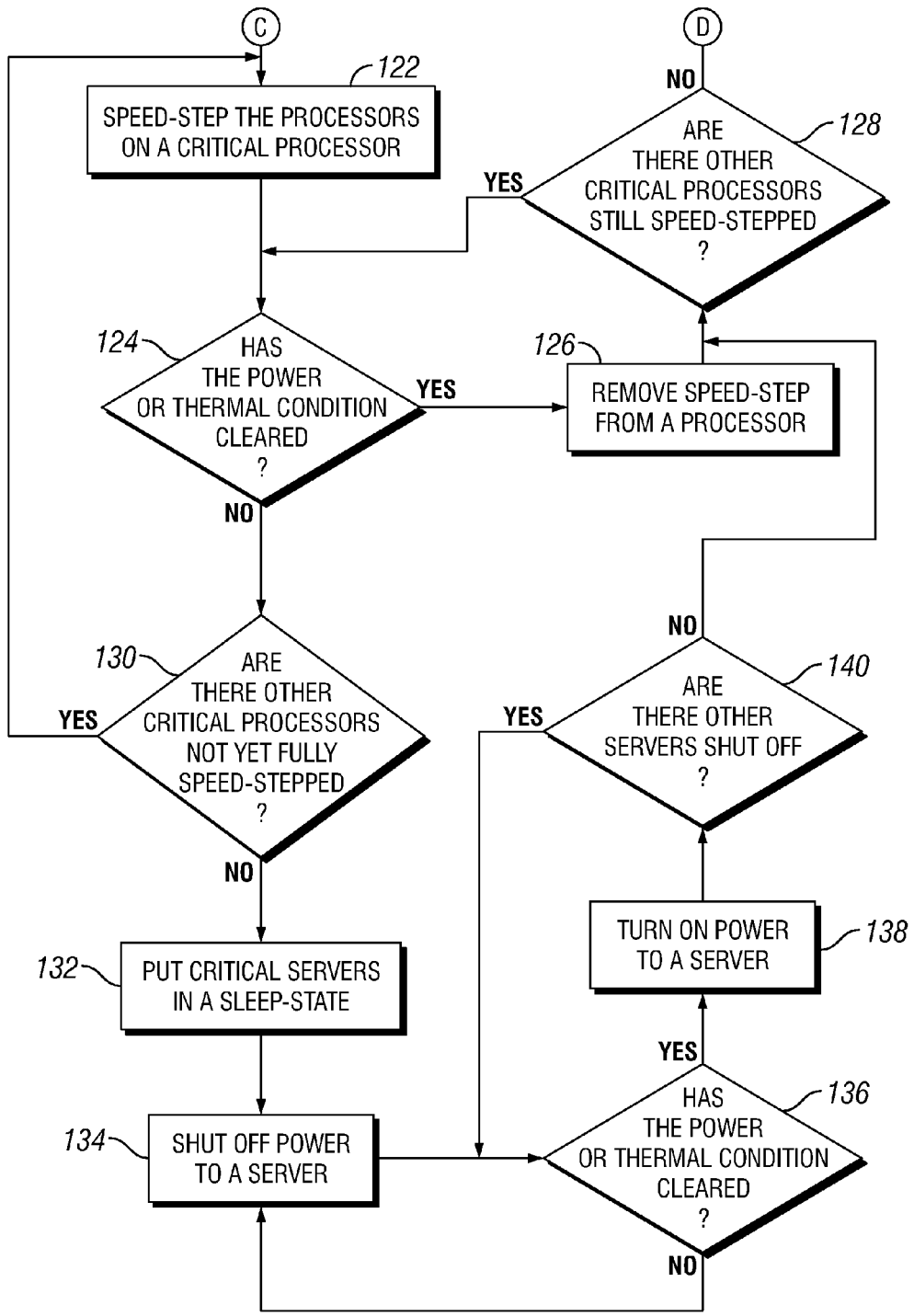

FIGS. 3A to 3C provide a flowchart of a method for a managing power consumption or temperature within the chassis. In step 100 of FIG. 3A, it is determined whether the chassis has reached a power or thermal threshold, such as a fixed or dynamic setpoint. If no threshold has been reached, the process returns until a threshold has been reached. Once a power or thermal threshold has been reached, then the speed of a processor in a non-critical blade server is reduced in step 102. In step 104, it is determined whether the power or thermal threshold condition has cleared. This may include the power consumption or processor temperature falling below the initial setpoint or some amount below the initial setpoint. Other conditions may also be monitored and determined to indicate that the condition has cleared. If the condition has cleared, then the reduced speed-step is removed from the processor in step 106 and it is determined whether there are other non-critical blade servers with processors still in a reduced speed-step in step 108. If all of the non-critical blade servers are back to full speed, then the process returns to step 100. However, if other non-critical blade servers are still at a reduced speed, then the process returns to steps 104 and 106 so that the speed-steps of additional non-critical blade servers are increased so long as the power or thermal condition continues to clear. If step 104 determines that the condition has not cleared, or has returned, then it is determined in step 110 whether there are other non-critical blade servers that are not at fully reduced speed-steps. If other non-critical blade servers can still be put in reduced speed-steps, then the process returns to step 102 for further reduction of speed steps. However, if all of the non-critical blade servers have been speed-stepped to their lowest speed, then the process continues to step 112 in FIG. 3B.

In FIG. 3B, step 112 changes the sleep-state of a non-critical blade server, preferably to either the "Stand-By" state (such as state S3 under ACPI) or the "Hibernate" state (such as state S4 under ACPI). In step 114, it is determined whether the power or thermal condition has cleared. If the condition has cleared, then the sleep state is removed from the blade server (i.e., the processor within the blade server is awakened or restarted to a working state) in step 116 and it is determined whether there are other non-critical blade servers still in a sleep state in step 118. If the processors in all of the non-critical blade servers are working, then the process returns to step 108. However, if other non-critical blade servers are still in a sleep state, then the process returns to steps 114 and 116 so that any other non-critical blade servers can be awakened or restarted so long as the power or thermal condition continues to be clear. If step 114 determines that the condition has not cleared, or has returned, then it is determined in step 120 whether there are other non-critical blade servers that are not in a sleep state. If other non-critical blade servers can still be put into a sleep state, then the process returns to step 112 for putting further non-critical blade servers to sleep. However, if all of the non-critical blade servers are already in a sleep state, then the process continues to step 122 in FIG. 3C.

In FIG. 3C, step 122 reduces the speed of a processor within a critical blade server. This is seen as a last resort, since all of the non-critical blade servers have been put to sleep and the power or thermal condition continues to exist. In step 124, it is determined whether the power or thermal threshold condition has cleared as a result of speed-stepping the critical processor. This may include the power consumption or processor temperature falling below the initial setpoint or some amount below the initial setpoint. Other conditions may also be monitored and determined to indicate that the condition has cleared. If the condition has cleared in step 124, then the reduced speed-step is removed from the critical blade server in step 126 and it is determined whether there are other critical blade servers still in a reduced speed-step in step 128. If all of the critical blade servers are back to full speed, then the process returns to step 118. However, if other critical blade servers are still at a reduced speed, then the process returns to steps 124 and 126 so that the speed-steps of additional non-critical blade servers are increased so long as the power or thermal condition continues to be clear. If step 124 determines that the condition has not cleared, or has returned, then it is determined in step 130 whether there are other critical blade servers that are not at fully reduced speed-steps. If other critical blade servers can still be put in reduced speed-steps, then the process returns to step 122 for further reduction of speed steps. However, if the processors of all of the critical blade servers have been speed-stepped to their lowest speed, then the process continues to step 132 where the critical blade servers are put into a sleep state. If the condition still does not clear, then step 134 may be performed to shut off power to a blade server. Since the BMC is running on standby power, it can, together with the management entity, determine when the critical temperature or power condition has cleared, as set out in step 136. When the condition has cleared, then power can be turned back on to a critical blade as in step 138, preferably in conjunction with step 140 so that the servers can be turned on one-by-one so long as the condition remains cleared.

Figure 4:
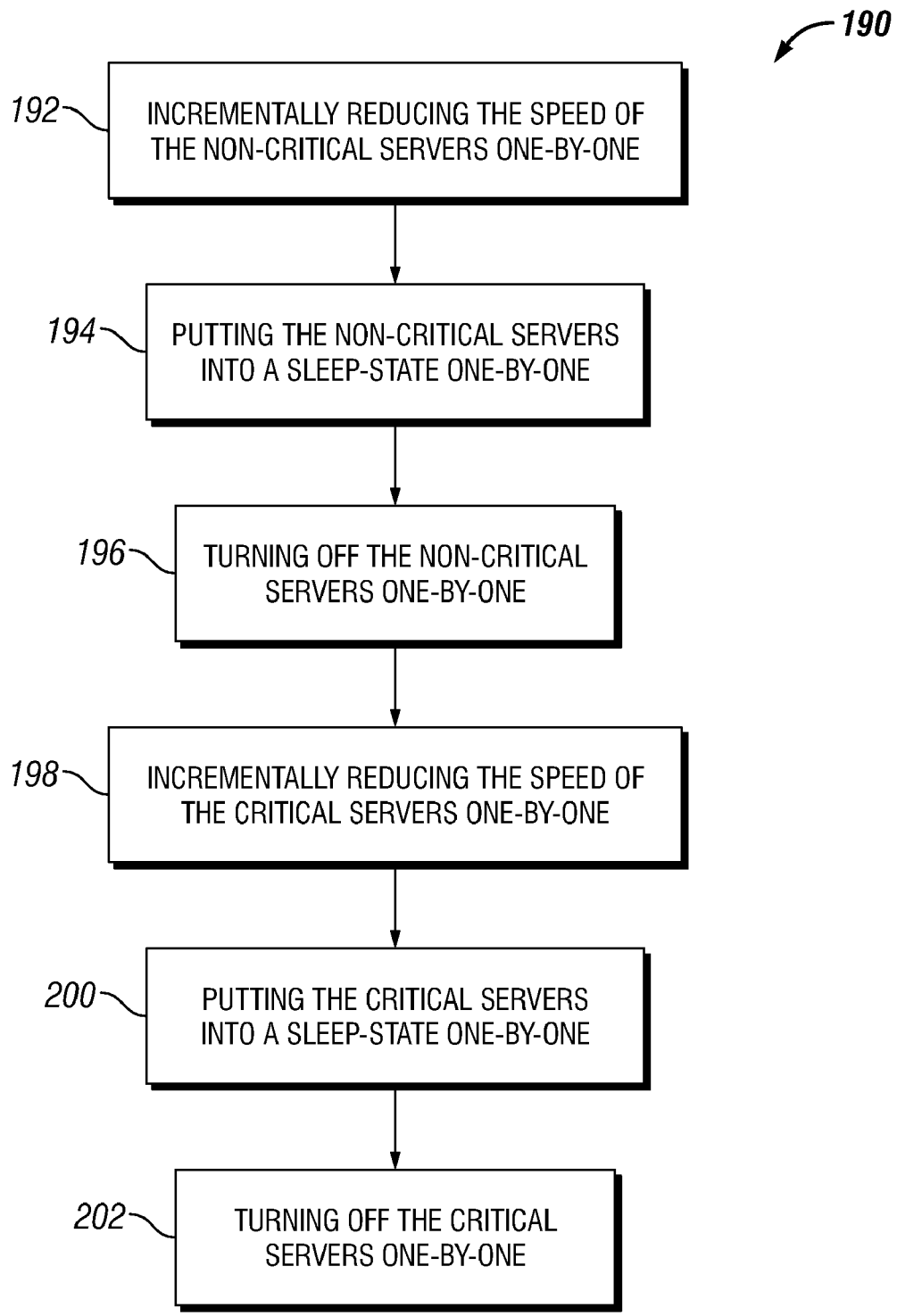
FIG. 4 is a flowchart of a method for managing power consumption or temperature within a chassis.

While the foregoing method describes one embodiment in specific terms, it should be recognized that other and further detailed steps may be included. A further embodiment may be described in broader terms as shown in FIG. 4. The method 190 describes a preferred hierarchy of steps to take until the power or thermal thresholds are met. In the order of their preferred use, these steps include incrementally reducing the speed of the non-critical servers one-by-one (step 192), put the non-critical servers into a sleep state one-by one (step 194), turning off the non-critical servers one-by-one (step 196), incrementally reducing the speed of the critical servers one-by-one (step 198), put the critical servers into a sleep state one-by one (step 200), and then turning off the critical servers one-by-one (step 202).

Figure 5A:
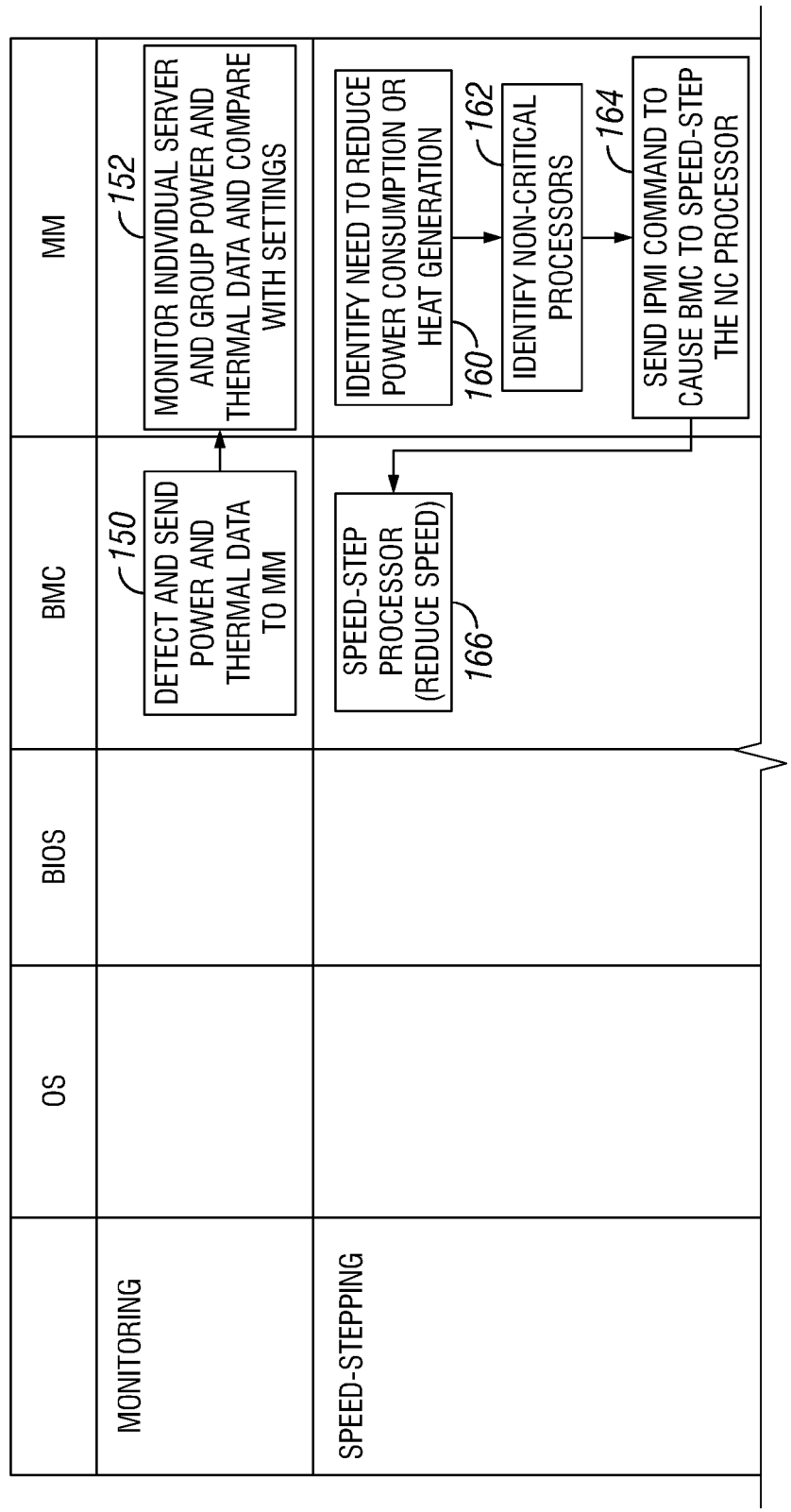
FIGS. 5A to 5B provide a flowchart of method steps for monitoring power consumption and temperature, speed-stepping a processor and changing the sleep-state of a processor within a blade server.
Figure 5B:
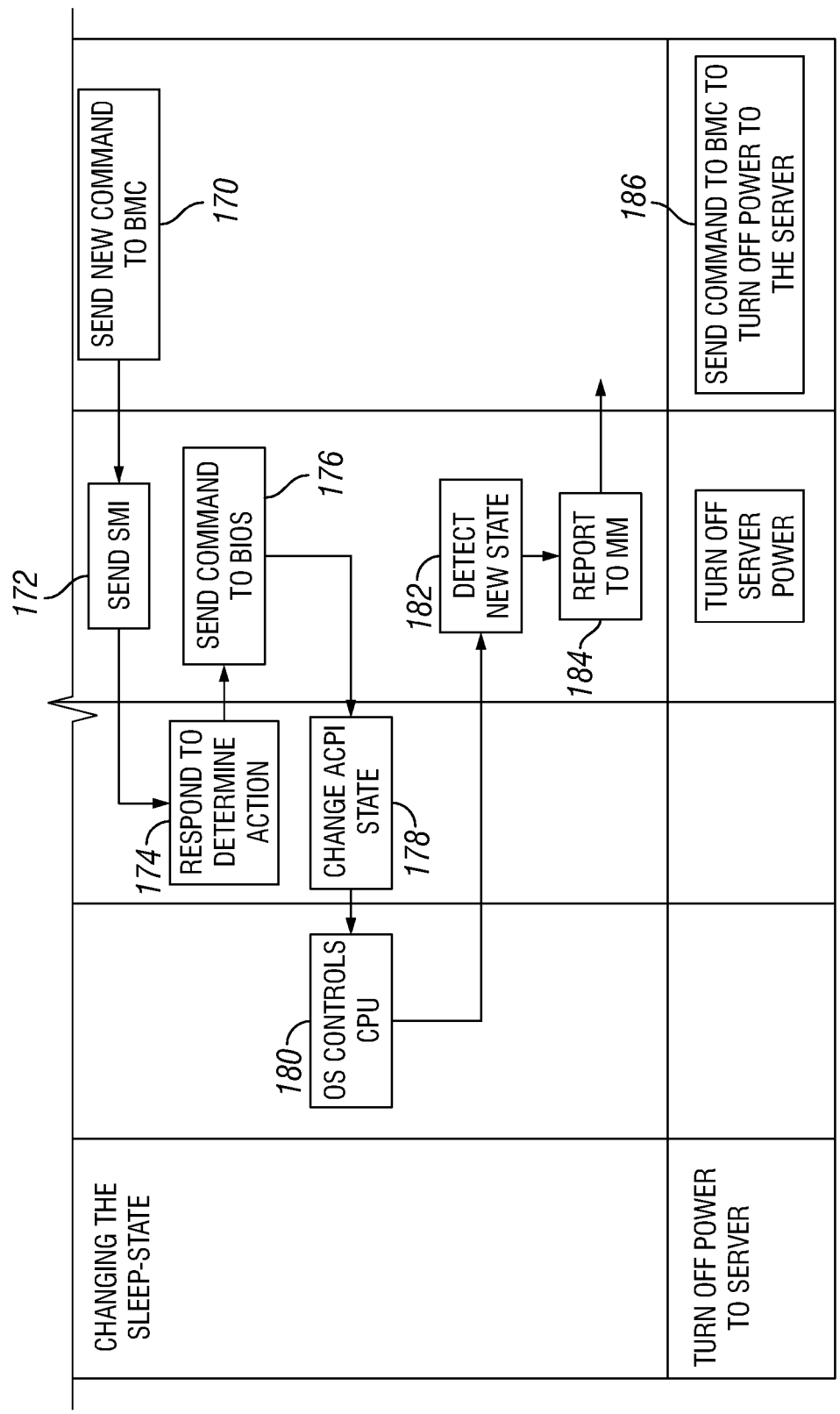

FIGS. 5A and 5B provide a flowchart of method steps for monitoring power consumption and temperature, speed-stepping a processor and changing the sleep-state of a processor. This flowchart emphasizes that although the steps of FIGS. 3A to 3C may be implemented in program code within the management module, the execution of management module (MM) instructions also involves operations within the operating system (OS), basic input output system (BIOS), and baseboard management controller (BMC). Accordingly, in step 150, the BMC detects and sends power and thermal sensor record data to the management module. In step 152, the management module monitors power and thermal data from the BMC and compares that data with power and thermal settings. Collectively, steps 150 and 152 may be considered as "monitoring" steps that would be suitable to determine whether the chassis has reached or cleared a power or thermal threshold, as required in steps 100, 104, 114, and 124.

When the management module identifies a need to reduce power consumption or heat generation in step 160, then a non-critical blade server is identified from a data table previously setup by the system administrator and accessible to the management module in step 162. In step 164, an IPMI command is sent to the BMC to cause the BMC to speed step the non-critical blade server. As shown, the BMC received the command and speed steps the processor of that non-critical blade server to a reduced speed. However, as previously disclosed, the speed step may involve sending an IPMI message to the operating system to implement the speed-step. These and other embodiments for speed-stepping are considered to be within the scope of the invention. Collectively, steps 160, 162, 164 and 166 may be considered as "speed-stepping" that would be suitable to cause a change in the processor speed, as required in steps 102, 106 (for a non-critical blade server), 122, and 126 (for a critical blade server).

When the management module determines that power or thermal management requires putting a processor in a sleep state, then the management module sends a sleep state command to the BMC in step 170, the BMC issues a system management interrupt to the BIOS in step 172, the BIOS responds in step 174 to determine the action required, and the BMC sends the command to the BIOS in step 176. In step 178, the BIOS, which may be executing from system memory, or AML method changes the ACPI state of the processor. The operating system controls and monitors the processor or CPU in step 180. Sensors reporting to the BMC detect the new state of the processor in step 182 and reports the state of the processor to the management module in step 184. Collectively, steps 170 to 184 may be considered as "changing the sleep state" that would be suitable to cause a change in the processor sleep state, as required in steps 112, 116.

If the management module determines that a server should be turned off, then the management module sends a command to the BMC in step 186, and the BMC turns off the power to the server in step 188. It should be recognized that even though the power to the server is off, the BMC and management module are still able to monitor and control the server and will be able to turn on the server when the condition has cleared.

It should be recognized that the invention may take the form of an embodiment containing hardware and/or software elements. Non-limiting examples of software include firmware, resident software, and microcode. More generally, the invention can take the form of a computer program product accessible from a computer-readable medium providing program code for use by or in connection with a computer or any instruction execution system. For the purposes of this description, a computer-usable or computer readable medium can be any apparatus that can contain, store, communicate, propagate or transport the program for use by or in connection with the instruction execution system, apparatus or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), and DVD.

A data processing system suitable for storing and/or executing program code typically includes at least one processor coupled directly or indirectly to memory elements through a system bus. The memory elements can include local memory employed during actual execution of the program code, bulk storage, and cache memories that provide temporary storage of at least some program code in order to reduce the number of times code must be retrieved from bulk storage during execution.

Input/output (I/O) devices such as keyboards, displays, or pointing devices can be coupled to the system, either directly or through intervening I/O controllers. Network adapters may also be used to allow the data processing system to couple to other data processing systems or remote printers or storage devices, such as through intervening private or public networks. Modems, cable modems, Ethernet cards, and wireless network adapters are examples of network adapters.

Figure 6:
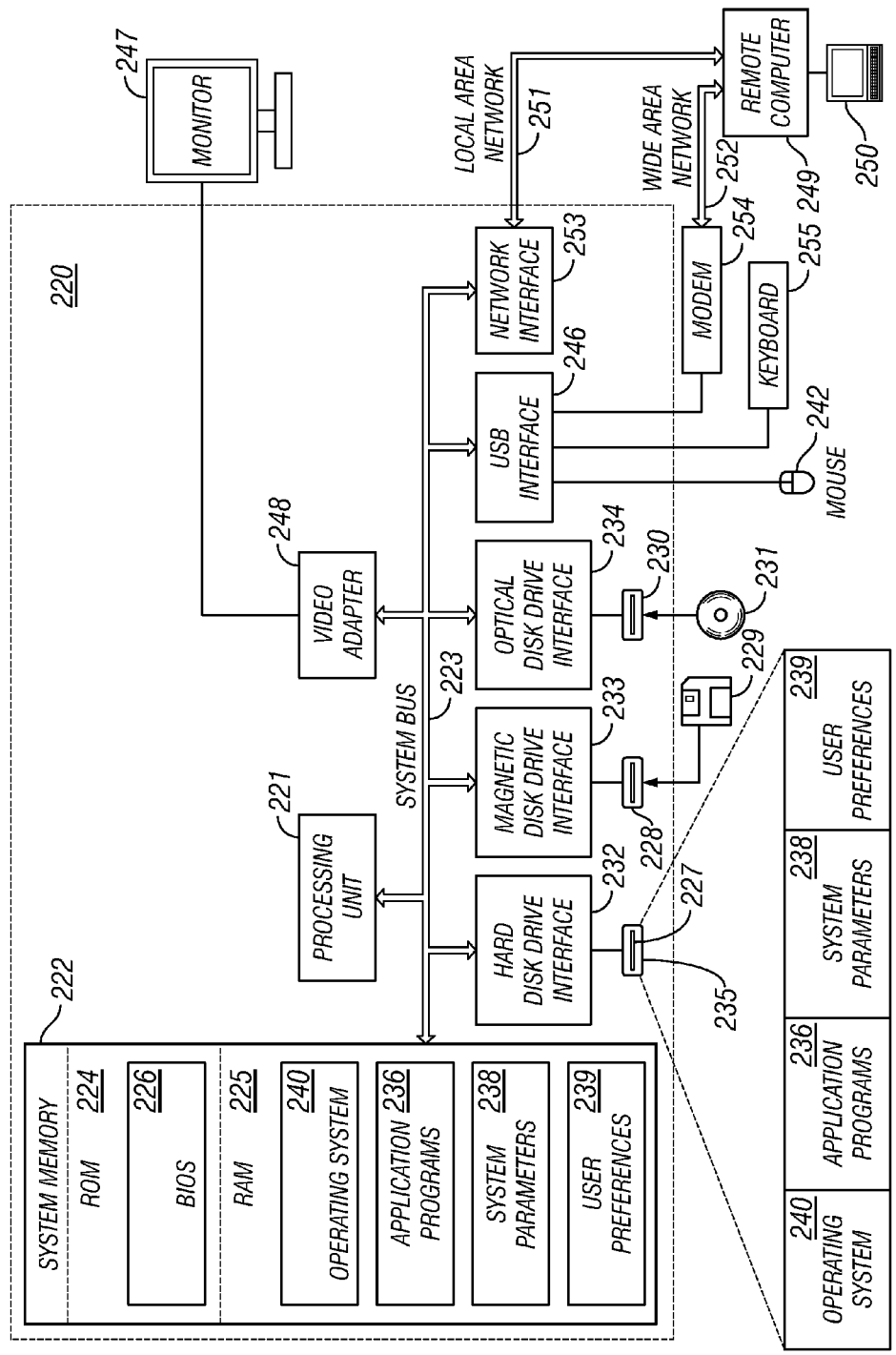
FIG. 6 is a schematic diagram of a computer system that may have its power managed according to the invention.

FIG. 6 is a schematic diagram of a computer system generally indicated at 220 that may be configured as a satellite management controller for managing power in a target system of devices according to the invention. The computer system 220 may be a general-purpose computing device in the form of a conventional computer system 220. The computer system 220 may, itself, include the target system for which power is to be managed. Alternatively, the computer system 220 may be external to the target system. Generally, computer system 220 includes a processing unit 221, a system memory 222, and a system bus 223 that couples various system devices, including the system memory 222 to processing unit 221. System bus 223 may be any of several types of bus structures including a memory bus or memory controller, a peripheral bus, and a local bus using any of a variety of bus architectures. The system memory includes a read only memory (ROM) 224 and random access memory (RAM) 225. A basic input/output system (BIOS) 226 is stored in ROM 224, containing the basic routines that help to transfer information between elements within computer system 220, such as during start-up.

Computer system 220 further includes a hard disk drive 235 for reading from and writing to a hard disk 227, a magnetic disk drive 228 for reading from or writing to a removable magnetic disk 229, and an optical disk drive 230 for reading from or writing to a removable optical disk 231 such as a CD-R, CD-RW, DV-R, or DV-RW. Hard disk drive 235, magnetic disk drive 228, and optical disk drive 230 are connected to system bus 223 by a hard disk drive interface 232, a magnetic disk drive interface 233, and an optical disk drive interface 234, respectively. Although the exemplary environment described herein employs hard disk 227, removable magnetic disk 229, and removable optical disk 231, it should be appreciated by those skilled in the art that other types of computer readable media which can store data that is accessible by a computer, such as magnetic cassettes, flash memory cards, digital video disks, Bernoulli cartridges, RAMs, ROMs, USB Drives, and the like, may also be used in the exemplary operating environment. The drives and their associated computer readable media provide nonvolatile storage of computer-executable instructions, data structures, program modules, and other data for computer system 220. For example, the operating system 240 and application programs 236 may be stored in the RAM 225 and/or hard disk 227 of the computer system 220.

A user may enter commands and information into computer system 220 through input devices, such as a keyboard 255 and a mouse 242. Other input devices (not shown) may include a microphone, joystick, game pad, touch pad, satellite dish, scanner, or the like. These and other input devices are often connected to processing unit 222 through a USB (universal serial bus) 246 that is coupled to the system bus 223, but may be connected by other interfaces, such as a serial port interface, a parallel port, game port, or the like. A display device 247 may also be connected to system bus 223 via an interface, such as a video adapter 248. In addition to the monitor, personal computers typically include other peripheral output devices (not shown), such as speakers and printers.

The computer system 220 may operate in a networked environment using logical connections to one or more remote computers 249. each of the one or more remote computers 249 may be another personal computer, a server, a client, a router, a network PC, a peer device, a mainframe, a personal digital assistant, an internet-connected mobile telephone or other common network node. While a remote computer 249 typically includes many or all of the elements described above relative to the computer system 220, only a memory storage device 250 has been illustrated in FIG. 6. The logical connections depicted in the figure include a local area network (LAN) 251 and a wide area network (WAN) 252. Such networking environments are commonplace in offices, enterprise-wide computer networks, intranets, and the internet.

When used in a LAN networking environment, the computer system 220 is often connected to the local area network 251 through a network interface or adapter 253. When used in a WAN networking environment, the computer system 220 typically includes a modem 254 or other means for establishing high-speed communications over WAN 252, such as the internet Modem 254, which may be internal or external, is connected to system bus 223 via USB interface 246. In a networked environment, program modules depicted relative to computer system 220, or portions thereof, may be stored in the remote memory storage device 250. It will be appreciated that the network connections shown are exemplary and other means of establishing a communications link between the computers may be used.

Program modules may be stored on hard disk 227, optical disk 231, ROM 224, RAM 225, or even magnetic disk 229. The program modules may include portions of an operating system 240, application programs 236, or the like. A system parameter database 238 may be included, which may contain parameters of the computer system 220 and its many nodes and other devices, such as the devices of the target system, along with their maximum operating capacities, maximum operating temperatures, and so forth that may be relevant to the management of power in the target system. A user preferences database 239 may also be included, which may contain parameters and procedures for how to apportion power among various devices of the target system, including any trigger conditions that may be used to initiate re-apportionment of power. The user preferences database 239 may also include, for example, a user preference designating whether power is to be apportioned evenly among the devices.

Aspects of the present invention may be implemented in the form of an application program 236. Application program 236 may be informed by or otherwise associated with system parameter database 238 and/or user preference database 239. The application program 236 generally comprises computer-executable instructions for managing power in the target system according to the invention.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of managing power consumed by a plurality of blade servers within a processing system, comprising:
    identifying at least one of the plurality of blade servers that is not critical to maintain in a working state; and
    putting a processor of the at least one non-critical blade server in a sleep state in response to determining that the processing system has reached a thermal or power threshold, wherein the step of putting the processor of at least one non-critical blade server in a sleep state includes sending an IPMI message from a satellite management controller to command a BMC to put the processor of the at least one non-critical blade server in a sleep state and sending an IPMI message from the BMC to command the operating system to put the processor of the at least one non-critical blade server in a sleep state.

2. The method of claim 1, further comprising:
    reducing the speed of a processor of at least one of the plurality of blade servers in response to determining that the processing system has reached a thermal or power threshold.

3. The method of claim 1, wherein the sleep state is a standby state that maintains power to main memory within the device while power is shut off to a majority of other components within the device.

4. The method of claim 1, wherein the sleep state is a hibernation state that saves the content of main memory within the device to a hard drive and powers off the main memory.

5. A method of managing power consumed by a plurality of blade servers within a processing system, comprising:
    identifying at least one of the plurality of blade servers that is not critical to maintain in a working state;
    putting a processor of the at least one non-critical blade server in a sleep state in response to determining that the processing system has reached a thermal or power threshold;
    reducing the speed of a processor of at least one of the plurality of blade servers in response to determining that the processing system has reached a thermal or power threshold; and
    changing the speed of the processor of the at least one non-critical blade server and changing the sleep state of at least one other non-critical blade server to control the power consumption below the power threshold or control the temperature below the thermal threshold.

6. The method of claim 5, further comprising:
    putting all of the non-critical blade servers in a sleep state; and changing the speed of at least one critical blade server to control the power consumption below the power threshold or control the temperature below the thermal threshold in response to determining that the step of putting the all of the non-critical blade servers in a sleep state was insufficient to control the power consumption below the power threshold or control the temperature below the thermal threshold.

7. The method of claim 6, further comprising:
turning off any or all of the non-critical servers to preserve available power for the critical servers remain operational.

8. A computer program product comprising a non-transitory computer usable storage medium including computer usable program code for managing power to a plurality of blade servers within a processing system, the computer program product including:
computer usable program code for identifying at least one of the plurality of blade servers that is not critical to maintain in a working state; and
computer usable program code for putting the at least one non-critical blade server in a sleep state in response to determining that the processing system has reached a thermal or power threshold, wherein the computer usable program code for putting the processor of at least one non-critical blade server in a sleep state includes computer usable program code for sending an IPMI message from a satellite management controller to command a BMC to put the processor of the at least one non-critical blade server in a sleep state and sending an IPMI message from the BMC to command the operating system to put the processor of the at least one non-critical blade server in a sleep state.

9. The computer program product of claim 8, further comprising:
computer usable program code for reducing the speed of at least one of the plurality of blade servers in response to determining that the processing system has reached a thermal or power threshold.

10. The computer program product of claim 8, wherein the sleep state is a standby state that maintains power to main memory within the device while power is shut off to a majority of other components within the device.

11. The computer program product of claim 8, wherein the sleep state is a hibernation state that saves the content of main memory within the device to a hard drive and powers off the main memory.

12. The computer program product of claim 6, further comprising:
computer usable program code for changing the speed of at least one non-critical blade server and changing the sleep state of at least one other non-critical blade server to control the power consumption below the power threshold or control the temperature below the thermal threshold.

13. The computer program product of claim 12, further comprising:
computer usable program code for putting the all of the non-critical blade servers in a sleep state; and
computer usable program code for changing the speed of at least one critical blade server to control the power consumption below the power threshold or control the temperature below the thermal threshold in response to determining that the step of putting the all of the non-critical blade servers in a sleep state was insufficient to control the power consumption below the power threshold or control the temperature below the thermal threshold.

14. A power-controlled processing system, comprising:
a plurality of rack-mounted, ACPI-capable blade servers, each blade server having a processor running an operating system and a baseboard management controller in digital communication with the operating system;
a shared power supply providing electrical power to each of the plurality of blade servers;
a satellite management controller in digital communication with each of the baseboard management controllers, wherein the satellite management controller includes computer usable program code embodied on a non-transitory computer readable storage medium for identifying at least one of the plurality of processors that is not critical to maintain in a working state, and putting the at least one non-critical blade server in a sleep state in response to determining that the processing system has reached a thermal or power threshold, wherein the computer usable program code for putting the processor of at least one non-critical blade server in a sleep state includes computer usable program code for sending an IPMI message from a satellite management controller to command a BMC to put the processor of the at least one non-critical blade server in a sleep state and sending an IPMI message from the BMC to command the operating system to put the processor of the at least one non-critical blade server in a sleep state.

15. The power-controlled processing system of claim 14, wherein the satellite management controller further includes computer usable program code embodied on a non-transitory computer readable storage medium for reducing the speed of at least one of the plurality of blade servers in response to determining that the processing system has reached a thermal or power threshold.

16. The power-controlled processing system of claim 14, wherein the satellite management controller further includes computer usable program code embodied on a non-transitory computer readable storage medium for turning off any or all of the plurality of blade servers.

17. The method of claim 1, wherein the step of identifying at least one of the plurality of blade servers that is not critical to maintain in a working state, includes accessing a predetermined list identifying at least one blade server that is not critical.

18. The system of claim 14, wherein the sleep state is a standby state that maintains power to main memory within the device while power is shut off to a majority of other components within the device.

19. The system of claim 14, wherein the sleep state is a hibernation state that saves the content of main memory within the device to a hard drive and powers off the main memory.

20. The system of claim 15, wherein the satellite management controller further includes computer usable program code embodied on a non-transitory computer readable storage medium for changing the speed of the processor of the at least one non-critical blade server and changing the sleep state of at least one other non-critical blade server to control the power consumption below the power threshold or control the temperature below the thermal threshold.

* * * * *